United States Patent
Shim et al.

(10) Patent No.: US 7,109,109 B2
(45) Date of Patent: Sep. 19, 2006

(54) CONTACT PLUG IN SEMICONDUCTOR DEVICE AND METHOD OF FORMING THE SAME

(75) Inventors: Sung Bo Shim, Kyungki-Do (KR); Hee Hyun Chang, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/887,944

(22) Filed: Jul. 9, 2004

(65) Prior Publication Data
US 2005/0140016 A1 Jun. 30, 2005

(30) Foreign Application Priority Data
Dec. 30, 2003 (KR) .................. 10-2003-0100169

(51) Int. Cl.
*H01L 21/28* (2006.01)
(52) U.S. Cl. .................. 438/638; 438/620; 438/648; 438/675; 438/687; 257/377; 257/774
(58) Field of Classification Search .............. 438/618, 438/620, 637, 638, 648, 675, 685, 687, FOR. 355; 257/377, 774, E21.649, E23.141, E23.145
See application file for complete search history.

(56) References Cited

U.S. PATENT DOCUMENTS

| 6,143,648 | A | * | 11/2000 | Rodriguez et al. | ........... 438/640 |
| 6,518,173 | B1 | * | 2/2003 | Chan | ........... 438/637 |
| 6,583,046 | B1 | * | 6/2003 | Okada et al. | ........... 438/622 |
| 2003/0160273 | A1 | * | 8/2003 | Hieda | ........... 257/303 |
| 2003/0209727 | A1 | * | 11/2003 | Ohayashi et al. | ........... 257/200 |
| 2004/0051127 | A1 | * | 3/2004 | Tanaka | ........... 257/296 |
| 2004/0051131 | A1 | * | 3/2004 | Miyajima | ........... 257/306 |
| 2004/0076068 | A1 | * | 4/2004 | Yamada et al. | ........... 365/232 |
| 2004/0101977 | A1 | * | 5/2004 | Celinska et al. | ........... 438/3 |

FOREIGN PATENT DOCUMENTS

KR 100252914 B1 1/2000

* cited by examiner

*Primary Examiner*—George R. Fourson
*Assistant Examiner*—Joannie Adelle Garcia
(74) *Attorney, Agent, or Firm*—Marshall, Gerstein & Borun LLP

(57) ABSTRACT

Disclosed are a contact plug in a semiconductor device and method of forming the same. After a junction region where a contact plug is formed upwardly up to the bottom of a metal wire, the raised junction region and the metal wire are connected by a contact plug. Or after a first contact plug of the same area is formed on the junction region up to the bottom of the metal wires, the first contact plug is connected by a second contact plug. Thus, the width of the contact plug except for some portions is increased by maximum. It is thus possible to prevent an electric field from being concentrated and prohibit on-current from reduced, thus improving the electrical properties of devices.

14 Claims, 4 Drawing Sheets

CONTACT PLUG IN SEMICONDUCTOR DEVICE AND METHOD OF FORMING THE SAME

BACKGROUND

1. Technical Field

A contact plug in a semiconductor device and method of forming the same are disclosed, which can prevent an electric field from being concentrated, and method of forming the same.

2. Discussion of Related Art

Conventionally, the peripheral pitch is not critical compared to the cell pitch. As the level of integration in a device increases, however, the peripheral pitch becomes important as much as the cell pitch. For this reason, as the peripheral elements shrink as much as the cell, a metal layer that is difficult to shrink relatively compared to a device composed of polysilicon.

FIG. 1 is a cross-sectional view showing the structure of a contact plug in a semiconductor device in the related art and FIG. 2 is a cross-sectional view of the device taken along lines A–A' shown in FIG. 1.

Referring to FIG. 1 and FIG. 2, a transistor having a gate 103 and a source/drain 104 is formed in a semiconductor substrate 101. The gate 103 and the source/drain 104 are each connected to metal wires 109a and 109c through contact plugs 107a and 107b, respectively. Meanwhile, metal wires 109b for electrically connecting neighboring other elements are formed around the metal wires 109a and 109c each connected to the gate 103 and the source/drain 104. Unexplained reference numeral 102 indicates an isolation film, and 106 and 108 designate interlayer insulating films.

At this time, as the degree of integration in the device increases, it is required that the junction region of the transistor be connected to the metal wires with only a single contact plug. For example, although the area of the source/drain 104 is wide, various metal wires 109a and 109b are formed on the source/drain 104. Only the metal wire 109a of the metal wires 109a and 109b is connected to the source/drain 104. For this reason, there occurs a case where only one contact plug 107a has to be formed since the width of the metal wire 109a is narrow although the area of the source/drain 104 is wide.

In this case, an electric field (indicated by dotted arrows) is concentrated on the contact plug 107a having a narrow width. This may result in a problem that on-current is reduced compared to a case where several contact plugs are formed.

SUMMARY OF THE DISCLOSURE

A contact plug in a semiconductor device and method of forming the same are disclosed wherein after a junction region having a contact plug formed therein is formed up to the bottom of metal wires, the junction region and the metal wires are connected by a contact plug, or after a first contact plug of the same area is formed on the junction region up to the bottom of the metal wires, the first contact plug is connected to a second contact plug, whereby the width of the contact plug except for some portions of the contact plug is increased by maximum to prevent an electric field from being concentrated and prohibit on-current from being reduced, thereby improving the electrical properties of the device.

According to a preferred embodiment, there is provided a contact plug in a semiconductor device, wherein the contact plug is formed on a junction region of a semiconductor substrate and has a narrow top and a wide bottom in order to electrically connect any one of metal wires over the contact plug to the junction region while distributing an electric field.

In the above, it is preferred that the width and area of the bottom of the contact plug are the same as those of the junction region, and the top of the contact plug is formed to have a maximum width within a range that the contact plug is not electrically connected to neighboring metal wires considering the width of the metal wire connected to the contact plug.

According to another preferred embodiment, there is provided a contact plug in a semiconductor device, comprising: a first plug formed on a junction region of a semiconductor substrate; and a second plug formed on the first plug and connected to any one of metal wires over the second contact plug, wherein the width of the first plug is wider than that of the second plug.

In the above, the first plug may be formed using a polysilicon layer and the second plug may be formed using a metal material. At this time, the second plug can be formed using tungsten.

Meanwhile, the width and area of the first plug may be the same as those of the junction region. It is preferred that the first plug is formed to have a maximum height to the extent that electrical influences are minimized without directly contacting the metal wires.

It is preferable that the second plug is formed to have a maximum width within a range that the second plug is not electrically connected to neighboring metal wires considering the width of a metal wire connected to the second plug.

According to a preferred embodiment, there is provided a method of forming a contact plug in a semiconductor device, comprising: providing a semiconductor substrate in which a junction region such a source/drain is formed; forming a first plug on the junction region; forming an interlayer insulating film on the whole structure including the first plug; forming a contact hole in the interlayer insulating film on the first plug; and forming a second plug in the contact hole, wherein the width of the first plug is wider than that of the second plug.

The first plug may be formed using a polysilicon layer and may be formed by a selective epitaxial growth process. At this time, the first plug may be formed to have the same width as the junction region. Meanwhile, it is preferred that the first plug is formed to have a maximum height to the extent that electrical influences are minimized without directly contacting metal wires formed on the interlayer insulating film.

The second plug may be formed using a metal material and the second plug may be formed using tungsten. At this time, it is preferred that the second plug is formed to have a maximum width within a range that the second plug is not electrically connected to neighboring metal wires considering the width of a metal wire connected to the second plug.

Meanwhile, the first plug can be formed only in a region where the number of the second plug is 4 or less, and is formed so that the second plug directly connects the junction region and the metal wire in a region where the number of the second plug is 4 or more.

DETAILED DESCRIPTION OF THE PRESENTLY PREFERRED EMBODIMENTS

Figure 1:
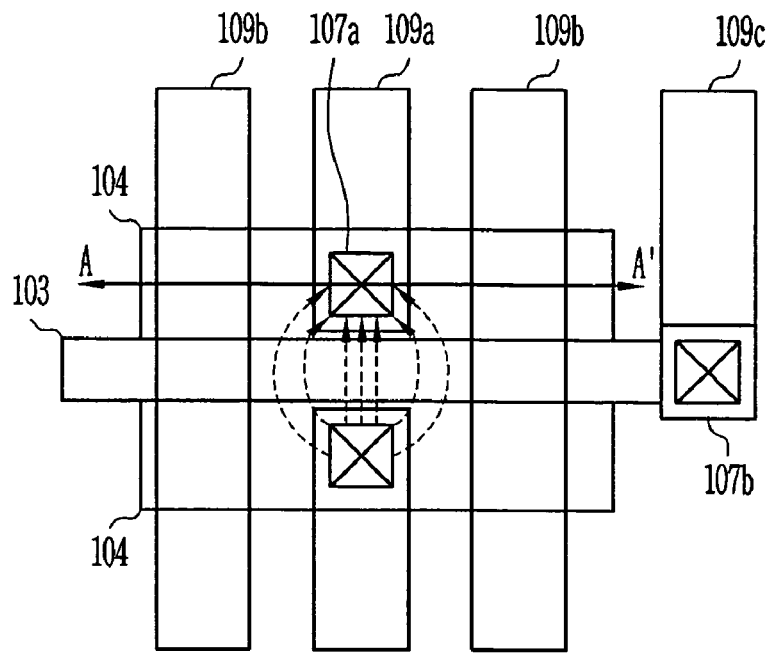
FIG. 1 is a cross-sectional view showing the structure of a contact plug in a semiconductor device in the related art.
Figure 2:
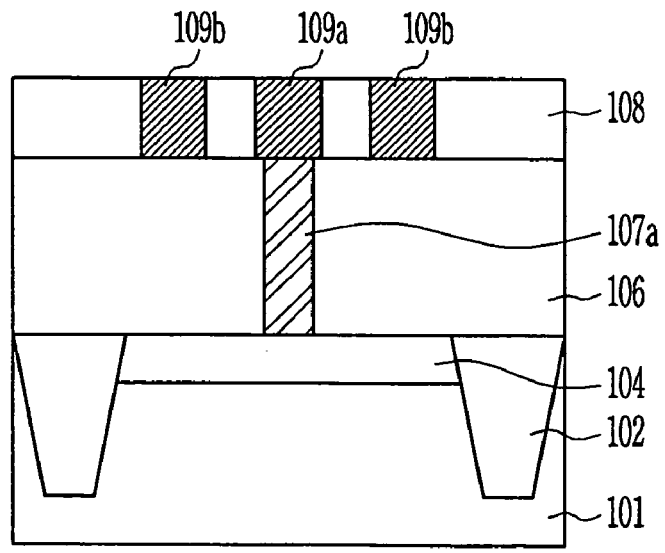
FIG. 2 is a cross-sectional view of the device taken along lines A-A' shown in FIG. 1.

Meanwhile, in case where it is described that one film is disposed "on"the another film or a semiconductor substrate, the one film may directly contact the other film or the semiconductor substrate or, a third intervening film may be disposed between the one film and the other film or the semiconductor substrate. Further, in the drawing, the thickness and size of each layer are not to scale and may be exaggerated for convenience of explanation and clarity. Like reference numerals are used to identify the same or similar parts.

Figure 3:
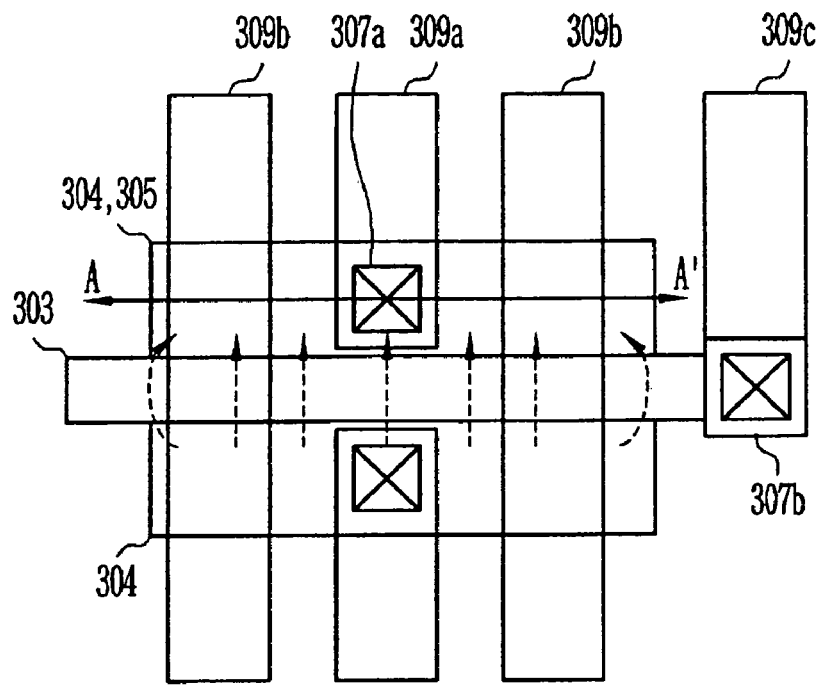
FIG. 3 is a cross-sectional view for explaining the structure of a contact plug in a semiconductor device according to an embodiment of the present invention.
Figure 4:
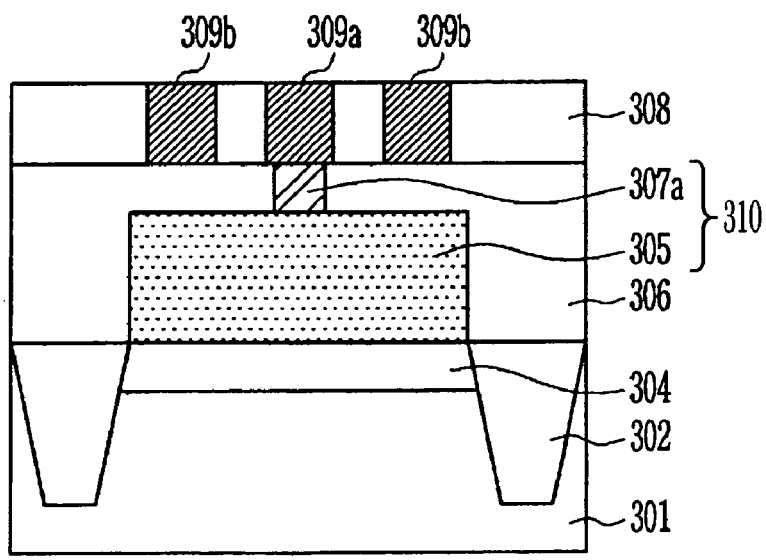
FIG. 4 is a cross-sectional view taken along lines A-A' shown in FIG. 3.

FIG. 3 is a cross-sectional view for explaining the structure of a contact plug in a semiconductor device according to an embodiment of the present invention and FIG. 4 is a cross-sectional view taken along lines A–A' shown in FIG. 3.

Referring to FIG. 3 and FIG. 4, a transistor having a gate 303 and a source/drain 304 is formed in a semiconductor substrate 301. The source/drain 304 is connected to a metal wire 309a through a contact plug 310 and the gate 303 is connected to a metal wire 309c through a second plug 307b. Meanwhile, other metal wires 309b for electrically connecting neighboring other elements are formed around the metal wires 309a and 309c each connected to the gate 303 and the source/drain 304. Unexplained reference numeral 302 indicates an isolation film and 306 and 308 designate interlayer insulating films.

Meanwhile, the contact plug 310 that connects the source/drain 304 and the metal wire 309a has a wide bottom and a narrow top. This will be described in the concrete.

The source/drain 304 has a wide area. Various metal wires 309a and 309b are formed over the source/drain 304. Only one of the metal wires 309a and 309b is connected to the source/drain 304. Due to this, since the width of the metal wire 309a is narrow although the area of the source/drain 304 is wide, only one contact plug for connecting the source/drain 304 and the metal wire 209 is formed.

In this case, as the width of the contact plug becomes narrow and an electric field is concentrated on the narrow width of the contact plug, on-current can be reduced. Therefore, the contact plug 310 that connects the source/drain 304 and the metal wire 309a is formed to have the bottom of a wide width and the top of a normal width.

For example, the contact plug 310 can be formed to have a stack structure of a first plug 305 and the second plug 307a. Also the bottom of the first plug 305 can be formed to have the same width and area as the junction region at the bottom of the contact plug 310 like the source/drain 304. Furthermore, the height of the first plug 305 is lower than that of the interlayer insulating film 306. This is because if the first plug 305 is formed to have the same height as the interlayer insulating film 306 or to have the height higher than the interlayer insulating film 306, the first plug 305 is electrically connected to the metal wires 309b formed around the metal wire 309a connected to the source/drain 304, resulting in fail. It is therefore preferred that the first plug 305 is formed high by maximum to the extent that electrical influences are minimized without directly contacting the neighboring metal wires 309b, while being formed higher than the height of the interlayer insulating film 306.

Furthermore, the second plug 307a is formed to have a maximum width to the extent that it is not electrically connected to a neighboring metal wire 309a considering the width of the metal wire 309a.

Meanwhile, the contact plug 310 can be formed by the following methods.

As a first method, a transistor having a gate 303 and a source/drain 304 is formed in a semiconductor substrate 301. Before an interlayer insulating film 306 is formed on the whole structure, a polysilicon layer is formed on a junction region such as a source/drain 304, thus forming a first plug 305. Thereafter, an interlayer insulating film 306 is formed on the whole structure and a second plug 307a is then formed through common processes. Thereby, a contact plug 310 having the first and second plugs 305 and 307a is formed. At this time, the second plug 307a can be formed using tungsten.

As a second method, a transistor having a gate 303 and a source/drain 304 is formed in a semiconductor substrate 301. Before an interlayer insulating film 306 is formed on the whole structure, only a region such as a source/drain 304 can be grown by a selective epitaxial growth process, thus forming a first plug 305. Thereafter, the interlayer insulating film 306 is formed on the whole structure and a second plug 307a is formed through typical processes. Thereby, a contact plug 310 having the first and second plugs 305 and 307a is formed. At this time, the second plug 307a can be formed using tungsten.

It is to be noted that the above methods are only embodiments of various methods for forming the contact plug 310, but the method for forming the first plug 305 is not limited to the above methods.

If the width of the contact plug 310 is formed wide by maximum as above, electrical properties of the device can be improved.

Figure 5:
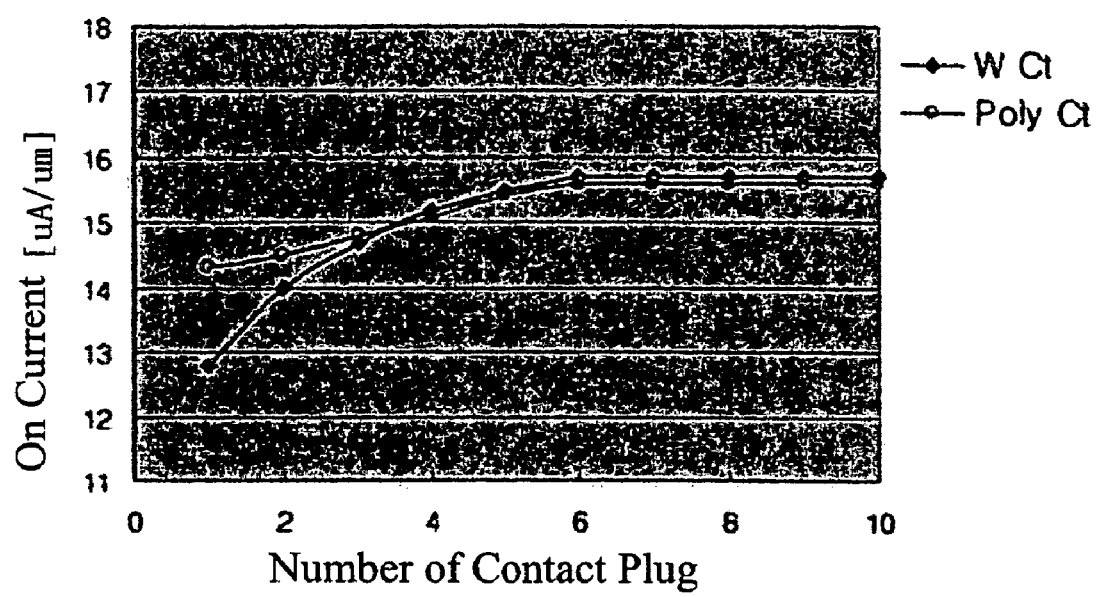
FIG. 5 is a characteristic graph showing a comparison result of a difference in the electrical properties of devices depending on the number of a contact plug.

FIG. 5 is a characteristic graph showing a comparison result of a difference in electrical properties of devices depending on the number of a contact plug.

Referring to FIG. 5, a first curve (W Ct) is a graph showing on-current properties depending on the number of a contact plug having only a second plug with a first plug not formed. A second curve (Poly Ct) is a graph showing on-current properties depending on a second plug formed on a first plug with the first plug formed.

The first curve (W Ct) and the second curve (Poly Ct) will now be compared. It can be seen that if the number of the contact plug is many, the electrical properties when only the second plug formed using tungsten is formed are better than those in the prior art, but if the number of the contact plug is small, the electrical properties when the first plug is formed and only the second plug is then formed on the first plug are good. For example, if the number of the second plugs is 4 or less, it is preferred that the first plug is formed to distribute an electric field in order to improve the electrical properties.

Figure 6:
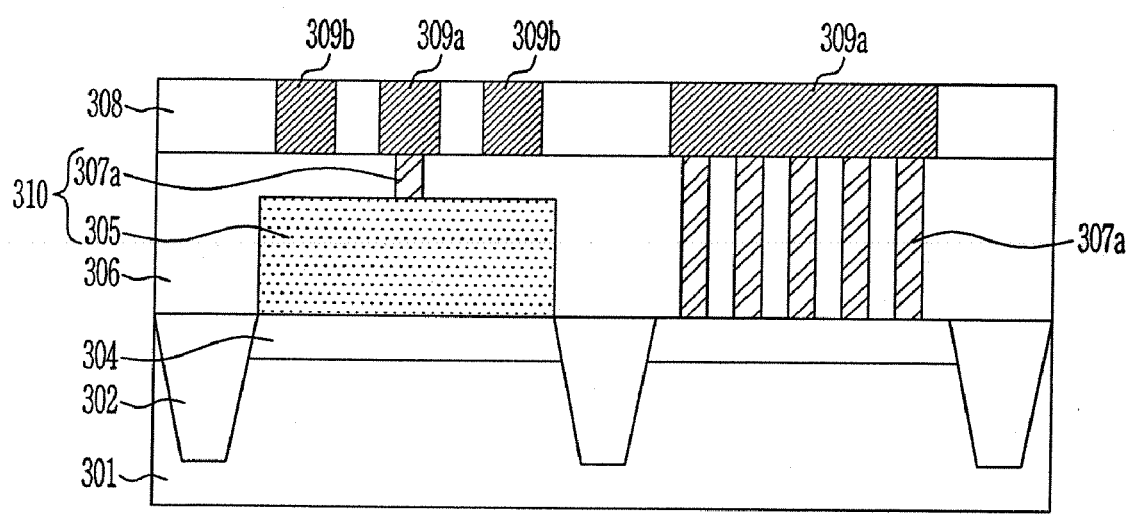
FIG. 6 is a cross-sectional view illustrating the structure of a contact plug in a semiconductor device according to an another embodiment.

Referring to FIG. 6, if the second plug 307a of 4 or more in number can be formed since the distance among the metal wires is wide or the metal wires 309a are formed with a sufficient width, the first plug is not formed but only the second plug 307a is formed so that the junction region 304 and the metal wire 309a are electrically connected by the second plug 307a. In other words, the first plug 305 can be formed only in a region where the second plugs of 4 or less in number is formed.

According to the present invention as described above, after a junction region where a contact plug is formed is formed up to the bottom of a metal wire, the raised junction region and the metal wire are connected by a contact plug, or after a first contact plug of the same area is formed on the junction region up to the bottom of the metal wires, the first contact plug is connected by a second contact plug. Thus, the width of the contact plug except for some portions is increased by maximum. It is thus possible to prevent an electric field from being concentrated and prohibit on-current from reduced, thus improving electrical properties of devices.

What is claimed is:

1. A contact plug in a semiconductor device, wherein the contact plug is formed on a junction region of a semiconductor substrate, the contact plug having a narrow top and a wide bottom, the narrow top electrically connecting the contact plug to a single metal wire disposed above the contact plug and the wide bottom of the contact plug distributing an electric field,
   wherein a width and a surface area of the wide bottom of the contact plug match a corresponding width and surface area of the junction region.

2. The contact plug as claimed in claim 1, wherein the narrow top of the contact plug is formed to have a maximum width so that the contact plug cannot be electrically connected to neighboring metal wires in addition the one metal wire connected to the narrow top of the contact plug.

3. A contact plug in a semiconductor device, comprising:
   a first wide plug formed on a junction region of a semiconductor substrate using a polysilicon layer; and
   a second narrow plug formed on top of the first wide plug using a metal material and connected to one metal wire disposed above the second narrow plug,
   wherein a width of the first wide plug is wider than that of the second narrow plug, and the first plug is formed only in a region where four or less second narrow plugs are formed and is formed so that the second narrow plug directly connects the junction region and the metal wire in a region where four or more second narrow plugs are formed.

4. The contact plug as claimed in claim 3, wherein the second narrow plug comprises tungsten.

5. The contact plug as claimed in claim 3, wherein a width and a surface area of the first wide plug match those of the junction region.

6. The contact plug as claimed in claim 3, wherein the first wide plug is formed to have a maximum height to the extent that electrical influences are minimized without directly contacting the metal wires.

7. The contact plug as claimed in claim 3, wherein the second narrow plug is formed to have a maximum width so that the second narrow plug cannot be electrically connected to neighboring metal wires in addition to the one metal wire connected to the second narrow plug.

8. A method of forming a contact plug in a semiconductor device, comprising:
   providing a semiconductor substrate in which a junction region is formed;
   forming a first plug on the junction region using a polysilicon layer;
   forming an interlayer insulating film on the first plug, the junction region and the substrate;
   forming a contact hole through the interlayer insulating film to the first plug; and
   forming a second plug in the contact hole,
   wherein a width of the first plug is wider than a width of the second plug, and the first plug is formed only in a region where four or less second narrow plugs are formed and is formed so that the second narrow plug directly connects the junction region and the metal wire in a region where four or more second narrow plugs are formed.

9. The method as claimed in claim 8, wherein the first plug is formed by a selective epitaxial growth process.

10. The method as claimed in claim 8, wherein the width of the first plug is the same as a width of the junction region.

11. The method as claimed in claim 8, wherein the first plug is formed to have a maximum height to an extent that electrical influences are minimized without directly contacting metal wires formed above the interlayer insulating film.

12. The method as claimed in claim 8, wherein the second plug comprises a metal.

13. The method as claimed in claim 12, wherein the second plug comprises tungsten.

14. The method as claimed in claim 8, wherein the width of the second plug is not greater than a width of a the metal wire connected to the second plug.

* * * * *

UNITED STATES PATENT AND TRADEMARK OFFICE
CERTIFICATE OF CORRECTION

PATENT NO. : 7,109,109 B2 Page 1 of 1
APPLICATION NO. : 10/887944
DATED : September 19, 2006
INVENTOR(S) : Sung B. Shim et al.

It is certified that error appears in the above-identified patent and that said Letters Patent is hereby corrected as shown below:

At Column 6, line 50, "width of a the" should be --width of the--.

Signed and Sealed this

Twenty-third Day of January, 2007

JON W. DUDAS
*Director of the United States Patent and Trademark Office*